United States Patent
Sandionigi et al.

(10) Patent No.: US 9,984,185 B2
(45) Date of Patent: May 29, 2018

(54) METHOD FOR ANALYZING THE BEHAVIOR OF AN INTEGRATED CIRCUIT IMPLEMENTED BY COMPUTER

(71) Applicant: COMMISSARIAT A L'ENERGIE ATOMIQUE ET AUX ENERGIES ALTERNATIVES, Paris (FR)

(72) Inventors: Chiara Sandionigi, Paris (FR); Olivier Heron, Bullion (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 44 days.

(21) Appl. No.: 14/914,622

(22) PCT Filed: Sep. 3, 2014

(86) PCT No.: PCT/EP2014/068759
§ 371 (c)(1),
(2) Date: Feb. 25, 2016

(87) PCT Pub. No.: WO2015/032829
PCT Pub. Date: Mar. 12, 2015

(65) Prior Publication Data
US 2016/0224708 A1 Aug. 4, 2016

(30) Foreign Application Priority Data
Sep. 5, 2013 (FR) ...................... 13 58534

(51) Int. Cl.
*G06F 17/50* (2006.01)
(52) U.S. Cl.
CPC ................ *G06F 17/5022* (2013.01)

(58) Field of Classification Search
CPC .................................................. G06F 17/5022
See application file for complete search history.

(56) References Cited

U.S. PATENT DOCUMENTS

| | | | |
|---|---|---|---|
| 7,836,418 B2 | 11/2010 | Binder et al. | |
| 2004/0019859 A1 | 1/2004 | Ravi et al. | |
| 2014/0062555 A1* | 3/2014 | Osborn | G06F 17/5031 327/160 |

OTHER PUBLICATIONS

S. Gupta et al., "Energy and peak-current per-cycle estimation at RTL," IEEE Transactions on Very Large Scale Integration (VLSI) Systems, vol. 11, No. 4, Aug. 1, 2003, pp. 525-537, XP011100551.

(Continued)

*Primary Examiner* — Stacy Whitmore
(74) *Attorney, Agent, or Firm* — Baker & Hostetler LLP (57) ABSTRACT

A method for analyzing the behavior of an integrated circuit implemented by computer comprises: the extraction of the names of the physical components described at the RTL (or higher) level, therefore of the physical components represented, as well as the names of the modules; the extraction of the names of the physical components of a path of the circuit at the logic gate level; the labeling of the names of the physical components of the paths with the names of the known physical components or the names of the parent modules; the extraction of the physical parameters of results of simulation/analysis of the circuit at the higher level. The output is composed of associative arrays containing the physical parameters of the physical components described at the envisaged level; the assignment of the physical parameters determined in the previous step, to the labeled components of the paths.

10 Claims, 4 Drawing Sheets

(56) References Cited

OTHER PUBLICATIONS

A. Bogliolo et al., "Regression-based RTL power modeling," ACM Transactions on Design Automation of Electronic Systems, vol. 5, No. 3, Jul. 31, 2000, pp. 337-372, XP058039299.
S. Gupta et al., "Power Macromodeling for High Level Power Estimation," Proceedings of the Design Automation Conference, Conf. 34, Jun. 9, 1997, pp. 365-370, XP010227610.
C. Bertolini et al., "Relation between HCI-induced performance degradation and applications in a RISC processor," 2012 IEEE 18th International On-Line Testing Symposium (IOLTS), Jun. 27, 2012, pp. 67-72, XP032243081.
V. Huard et al., "A predictive bottom-up hierarchical approach to digital system reliability," 2012 IEEE International Reliability Physics Symposium (IRPS), Apr. 15, 2012, pp. 4B.1.1-4B.1.10, XP032204916.
A. Raghunathan et al., "High-Level Macro-Modeling and Estimation Techniques for Switching Activity and Power Consumption," IEEE Transactions on Very Large Scale Integration (VLSI) Systems, vol. 11, No. 4, Aug. 2003. pp. 538-557.
Sheng Li et al., "McPAT: An Integrated Power, Area, and Timing Modeling Framework for Multicore Architectures," Micro'09, Dec. 12-16, 2009.
O. Heron et al., "On the simulation of HCI-induced variations of IC timings at high level," Journal of Electronic Testing, 2013, vol. 29, No. 2, pp. 127-141.

\* cited by examiner

METHOD FOR ANALYZING THE BEHAVIOR OF AN INTEGRATED CIRCUIT IMPLEMENTED BY COMPUTER

CROSS-REFERENCE TO RELATED APPLICATIONS

This application is a National Stage of International patent application PCT/EP2014/068759, filed on Sep. 3, 2014, which claims priority to foreign French patent application No. FR 1358534, filed on Sep. 5, 2013, the disclosures of which are incorporated by reference in their entirety.

FIELD OF THE INVENTION

The field of the invention is that of the design of integrated circuits. Generally, the design of an integrated circuit (IC) follows a top-down approach. It starts for example with a semi behavioral-structural description and terminates with a detailed description of its hardware realization. At each development step, a verification phase validates the description made of the IC in relation to the specification. Verification consists in particular in simulating the behavior of the IC. The simulation of an abstract description is faster than the simulation of a detailed realization of the IC.

Background

At the register transfer level (RTL), the system is generally formed of registers, of finite state machines, of combinatorial functions and of signals which link the other entities together. At the lower, logic gate, level, the system is composed of registers, logic cells (for example AND, OR, NOT-OR-AND, etc.) and of signals. The description contains the physical components already represented at the higher level and new physical components.

Generally, the notion of physical component covers a metal line on which a signal propagates or a logic cell (gate, flip-flop, multiplexer, etc.) and the notion of path is defined at the logic gate or gate level. The path is the serial composition signal-cell-signal-cell-etc. . . . , between the data output of one register and the data input of another register.

In most works which deal with the problem of the estimation of temporal characteristics at the RTL and higher level, the RTL physical components are assigned/annotated with values which have been estimated with techniques based on a prior characterization of the longest physical path or other techniques, such as described in particular in the article by: Anand Raghunathan, Sujit Dey, and Niraj K. Jha "High-Level Macro-Modeling and Estimation Techniques for Switching Activity and Power Consumption", IEEE Transactions On Very Large Scale Integration (VLSI) Systems, Vol. 11, No. 4, August 2003.

Whatever approach is adopted, the estimation of the propagation time of a signal between two registers at the RTL level is the sum of the (annotated) times of the physical components traversed by the signal.

The precision of these approaches is no longer satisfactory when the physical parameters of certain components for example transistors, vary in the course of time (for example the effects of aging or of temperature). The variation not being uniformly distributed over the set of transistors and in fact the paths, the signal propagation time depends on the path followed. For certain paths, their temporal margins may be violated, thus giving rise to a logical error. Under the condition of a variation of the physical parameters of the transistors, it is necessary to preserve the topology of the paths at the RTL and higher level.

In this general context, the objective is to calculate physical parameters of the path of an IC on the basis of the knowledge of the physical parameters of the physical components constituting the path at the RTL (or higher) level.

Figure 1:
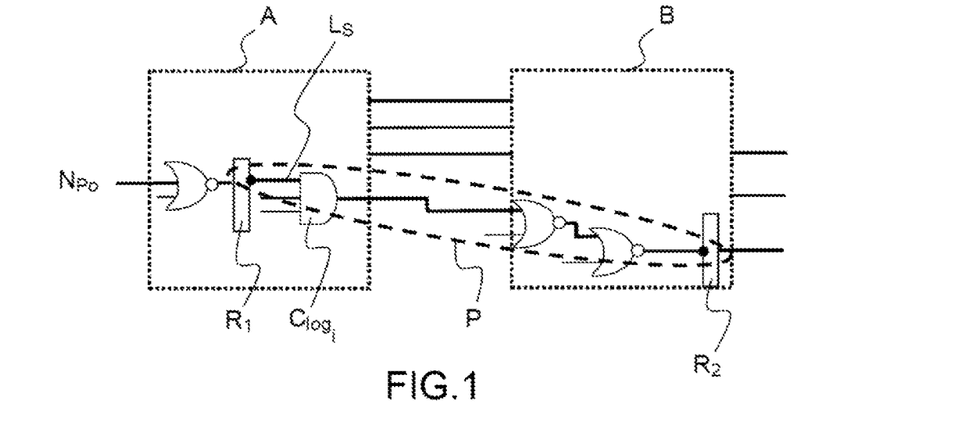
FIG. 1 illustrates an exemplary path at the gate level of abstraction.

FIG. 1 illustrates, at the gate level of abstraction $N_{Po}$, the signals (source, intermediate and termination) of a path P which are included in one and the same module, or are distributed among several modules, in this instance in FIG. 1, a module A and a module B, a module grouping together the physical components making it possible to carry out a function.

The path P shows the metal line on which a signal, referenced Ls, propagates. The path illustrated P passes through the modules A and B, said modules also comprising logic cells $C_{log\ i}$.

At this level of abstraction, all the physical components (metal line, logic cells, . . . ) constituting the paths are described, this makes it possible to evaluate their physical parameters directly, for example with the aid of a simulation of the IC.

The physical parameter of the path is a combination of the physical parameters of the physical components.

A physical parameter can be the switching frequency of a signal, the temporal characteristic of a cell, the duty cycle of a signal, etc.

At the higher levels of abstraction, the number of physical components described is lower. Those represented are called represented physical components: their description exists in both levels of abstraction.

Figure 2:
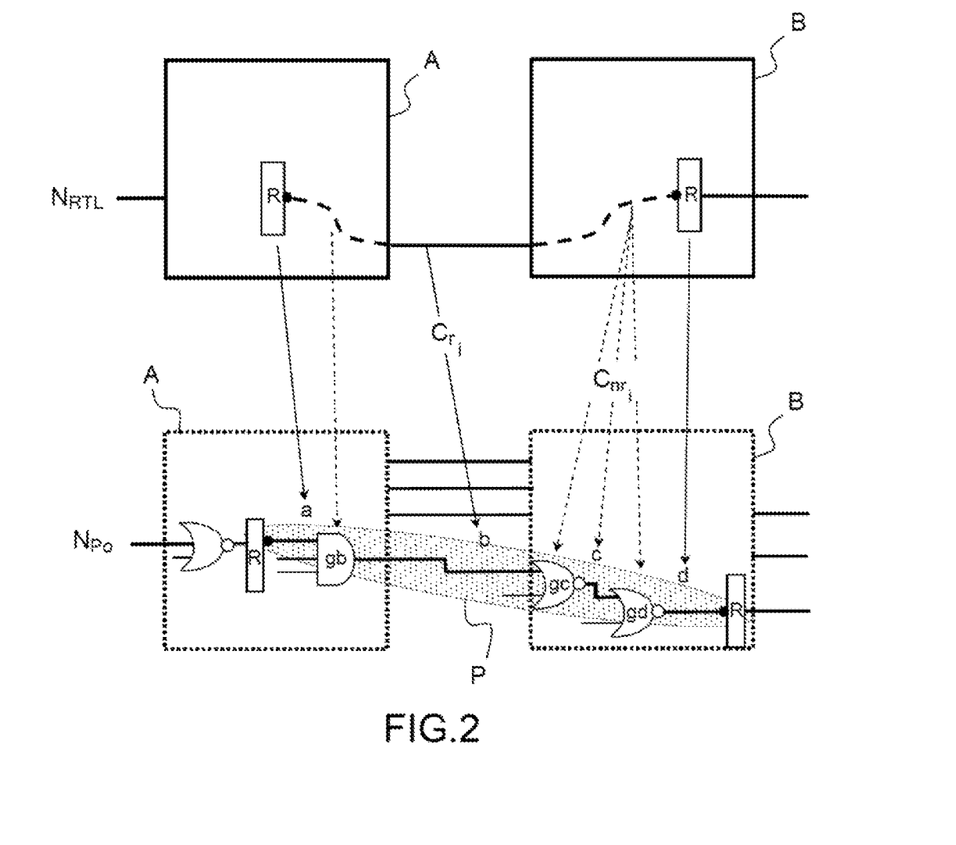
FIG. 2 places in parallel the path illustrated in FIG. 1 and this same path in an RTL level of abstraction.

FIG. 2 thus places in parallel, the gate level of abstraction $N_{Po}$ and an RTL level of abstraction: $N_{RTL}$, with non-represented physical components which are called non-represented physical components $C_{nri}$ (shown by dotted lines) whose physical parameters cannot be evaluated, and represented physical components $C_{ri}$ (shown by solid lines).

A path comprising non-represented physical components is called an incomplete path at the RTL level, and is illustrated in FIG. 2, by the path "a-gb-b-gc-c-gd-d".

The physical components which are represented (a, b and d) are thus shown by solid lines, whereas those which are not represented (gb, gc, c and gd) are shown by dotted lines.

At the RTL level, only the physical parameter of the signals a, b and d can be evaluated. A physical parameter of the path P: "a-gb-b-gc-c-gd-d" can be determined at the RTL level on the basis of that known for these signals alone.

It is clear that the result diverges from the value calculated at the gate level. The divergence is aggravated on the paths containing a large number of physical components.

In this context, the problem that the present invention seeks to solve is to carry out the estimation of the physical parameters of the physical components which are not represented at the RTL and higher level.

There has already been described and in particular in the articles by V. Huard et al., "A predictive bottom-up hierarchical approach to digital system reliability", Reliability Physics Symposium (IRPS), 2012 IEEE International and by Clement Bertolini, Olivier Héron, Nicolas Ventroux, François Marc, "Relation between HCI-induced performance degradation and applications in a RISC processor", IOLTS 2012, a scheme for the estimation of the temporal degradation of the logic cells and of the paths of an integrated circuit at the gate level. The authors present an equation which makes it possible to calculate the temporal degradation of a logic cell as a function of the activity of its input signals. The method includes the following steps: description of the circuit, simulation of the circuit, extraction of the physical paths and of their temporal characteristic, extraction of the activity of the signals and calculation of the degradation of the paths. Nonetheless, this solution does not make it possible to solve the problem posed in the present invention, since it does not deal with the problem of estimating the physical parameters of the paths at higher level of abstraction.

U.S. Pat. No. 7,836,418B2 presents a method which includes a step in which a path is assigned to modules in a hierarchical description of the circuit. This assignment is trivial since the name of the modules is included in the detailed description of the circuit. This method includes a step in which it associates a physical parameter with only certain signals of a path. The candidate signals are those situated at the input and at the output of a module. The physical parameter is determined with the aid of an analysis of the path.

A software environment for modeling area, lags and energy consumption of a multi-core circuit at various levels of abstraction has also been described in the article by Sheng Li, Jung Ho Ahn, Jay B. Brockman, Norman P. Jouppi, "McPAT: An Integrated Power, Area, and Timing Modeling Framework for Multicore Architectures", Micro'09 & technical report V1.0. The user enters physical parameters related to the geometric and physical characteristics which are thereafter assigned to the physical components of the circuit with the aim of modeling these properties. The environment generates the descriptions at the various levels of abstraction. At each level, the physical components will receive a unique value of physical parameter previously calculated by the software. The estimation of the propagation time of the signals at the higher levels of abstraction does not consider the path followed by these signals.

Patent application US20060253814 presents a method which includes a step (108) in which certain paths of the circuit are "placed" in arrays chosen from among a set of arrays. An array is referenced by the bounds of an interval of values of time. For a given path, the criterion for choosing the array is a comparison between the time of the path and the time bounds of the array. The array contains the name of a physical component. The selected physical component will be inserted onto the path (from a previously provided library). This step amounts to searching for an entry in an associative array whose key is the two time bounds and then assigning the content to the current path. Nonetheless, this method does not require the detailed knowledge of the physical components constituting the path. It does not therefore make it possible to solve the problem of the assignment of a physical parameter which is specific to each physical component of a path.

The article by the authors: O. Heron et al. "On the simulation of HCl-induced variations of IC timings at high level", Journ. Of Electronic Testing: Theory & App., to appear, discloses a scheme for the estimation of the temporal degradation of all the internal paths of a processor at the functional abstraction level. The solution proposes the following method; i) the generation of the trace of the instructions read by the processor with the aid of a simulation, ii) for each instruction and for each path, the instruction which is read enters a table which provides as output an activity value for the path (combination of the activity all the signals of the path), and iii) for each path and for the selected activity value, the calculation of the increment of the path's temporal degradation due to this instruction. The table in question is constructed beforehand with the aid of a characterization of the activity of the paths with several patterns of instructions.

This solution solves only the problem of the estimation of physical parameters of the paths belonging exclusively to the processor. Indeed, the solution does not employ a method which makes it possible to identify the non-represented physical components traversed by a path. This absence prevents the operation which judiciously assigns a physical parameter to each physical component of the path. This solution does not make it possible to solve the problem for paths distributed between at least two modules.

SUMMARY OF THE INVENTION

Thus in this context, the subject of the present invention is a method allowing the evaluation of physical parameter of the set of physical components of an integrated circuit, doing so at a higher level of abstraction than that of the gate level.

More precisely, it entails a method for analyzing the behavior of an integrated circuit comprising paths and physical components, implemented by computer, said physical components being either not represented in a first level of abstraction at least equal to or higher than the RTL level, or represented in said first level of abstraction;

said integrated circuit comprising a set of modules consisting of physical component(s);

each module defining a function between an input signal and an output signal, the physical components, the paths and the modules each being identified by a name, said method comprising the following steps:

a first step of extracting a first set of names corresponding to the physical components represented and to the modules;

a second step comprising the extraction of the names of the paths and those of the physical components for each of said paths and comprising the assignment of a membership module name to said physical compounds;

a third step allotting a label to the set of physical components:

said label being their name for the components represented;

said label being the name of the membership module for the components not represented;

a fourth step of determining at least one physical parameter for each of the components represented and for each of the modules, and of associating the names of the components represented with the physical parameters determined and of associating the names of the modules with the physical parameters determined;

a fifth step of assigning physical parameters determined and named in the fourth step, to the physical components named in the second extracting step.

According to a variant of the invention, the physical parameters of the physical components represented are obtained by simulation/analysis of the circuit at the higher level.

According to a variant of the invention, the assignment of a module to a physical component represented is carried out by the analysis of the hierarchy of the integrated circuit at the gate level. At this level of abstraction, the description of the integrated circuit details the membership of the physical components as regards whether they belong to the modules.

According to a variant of the invention, at least one module being traversed by several paths, the fourth step of determining at least one physical parameter for each of the modules comprises:

a step of stringing together at least two sub-steps:
 a first sub-step of pointing at the paths traversing each module;
 a second sub-step of determining for each path pointed at, the physical parameter associated with said module.

According to a variant of the invention, the third step allotting a label to the set of physical components furthermore comprises the assigning of a discriminant of the state represented and not represented, to each of the physical components.

According to a variant of the invention, the physical parameter can be the switching frequency of a signal or the holding time of a signal or the activity corresponding to the ratio between a (total) number of change of value or a number of cycles of holding at 1 or a number of cycles of holding at 0 of a signal and the number of cycles of the clock signal.

According to a variant of the invention, the physical parameter is the propagation lag of a logic cell.

According to a variant of the invention, the method comprises the construction of associative arrays with input keys and value fields so as to utilize the results of the second, third, fourth and fifth steps.

According to a variant of the invention, the first level of abstraction at least equal to or higher than the RTL level is a transactional-behavioral level (TLM), the modules being behavioral modules that may comprise at least one memory or a calculation unit or a control unit and TLM ports or interfaces which connect the modules together.

The subject of the invention is also a method for analyzing the behavior of an integrated circuit implemented by computer, comprising:
 the steps of the method of behavior analysis of an integrated circuit, implemented by computer, according to the invention;
 including a succession of at least two series of operations shifted in time for:
  said fourth step of determining at least one physical parameter for each of the components represented and for each of the modules, and of associating the names of the components represented and the names of the modules, with the physical parameters determined, the determination of at least one physical parameter for the physical components represented making it possible to establish a fourth associative array (TAB4) comprising the name of the physical components and their associated physical parameter;
 a step of comparing of the fifth steps of assigning physical parameters determined and named in the fourth step, to the physical components identified in the second extracting step, making it possible to follow the temporal evolution of said integrated circuit.

The subject of the invention is also a computer program comprising instructions for the execution of the method for analyzing the behavior of an integrated circuit implemented by computer, according to the invention, when the program is executed by a processor.

The subject of the invention is further a design module intended to be embedded onboard an integrated circuit comprising at least one calculation unit and a memory, implementing the method for analyzing the behavior of an integrated circuit implemented by computer according to the invention.

BRIEF DESCRIPTION OF THE DRAWINGS

The invention will be better understood and other advantages will appear on reading the nonlimiting description which follows and by virtue of the appended figures among which.

DETAILED DESCRIPTION OF THE INVENTION

The method of the present invention offers the advantage of being able to apply at various levels of abstraction higher than the gate level and its realization is independent of the circuit studied. It makes it possible to combine physical parameters relating to the paths (for example degradation of the propagation time of the signals on the path) and those independent of the notion of path (dissipated temperature of a set of physical components).

It can be implemented with software executable on a machine or software library, either of which may be coupled to other existing simulation software to perform the estimation of the temporal degradation of the paths of an onboard system at higher levels for example, RTL level and TLM (transactional-behavioral) transactional level.

The method of the present invention makes it possible to envisage the following advantages at the design level:
 the estimation of the degradation right from the first development cycles of the system: early removal of the risks and of the uncertainty in regard to the impact of the choices of design and of the technology on the final circuit;
 the analysis effort and the expertise can be transferred to the tool;
 ultimately an improvement in the productivity of the designer;
 an exploration of a large number of configurations of the architecture including the identification of the configurations which most (or least) affect the performance and the reliability of the system, this exploration also being able to be done without the knowledge of the technology and thus making it possible merely to undertake a comparative analysis between two choices of design.

The method of the invention comprises in particular and advantageously the estimation of one or more physical parameters of the physical components not represented constituting a path at the RTL or higher level of abstraction. The output is an associative array containing the physical parameters necessary for the calculation of the physical parameters of the paths and of the IC at the RTL and higher level of abstraction.

Figure 3:
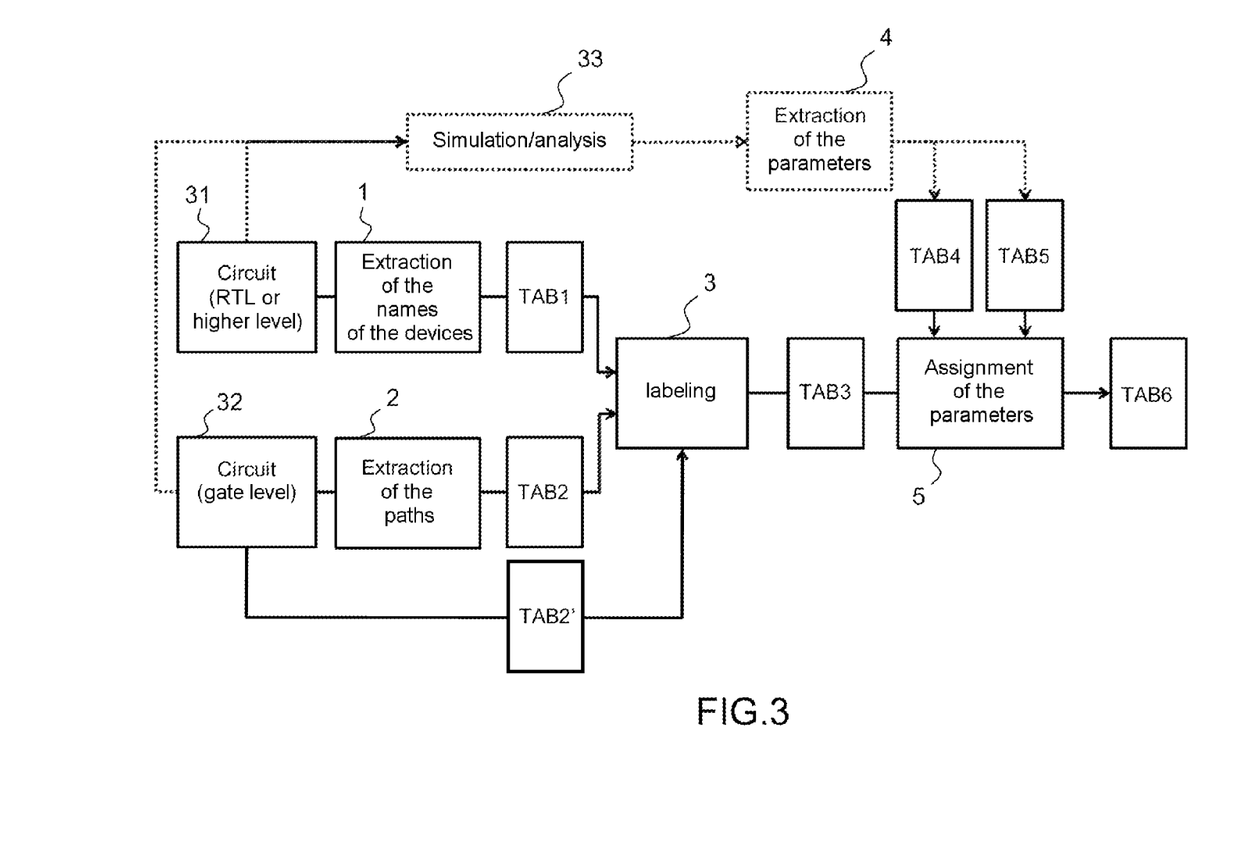
FIG. 3 illustrates the main steps of the method of the present invention.

The progress of the method is illustrated in FIG. 3. It decomposes mainly into 5 steps:
 Step 1: The extraction 1 of the name in the present description, of the physical components described at the RTL (or higher) level 31, therefore of the physical components represented, as well as the names of the modules. The output is an array TAB1 (detailed hereinafter).
 Step 2: The extraction 2 of the name of the physical components of a path of the circuit at the logic gate level 32. The output is an associative array TAB2 (detailed hereinafter).

In parallel, there has been established an associative array of the names of the physical components and of the names of their membership module, on the basis of the detailed description of the integrated circuit.

Step 3: The labeling 3 of the names of the physical components of the paths (TAB2) with the name of the known physical components or known module in the array TAB1. The output is an associative array TAB3 (detailed hereinafter).

Step 4: The extraction 4 of the physical parameters from the results of simulation/analysis of the circuit at the higher level. The output is composed of associative arrays containing the physical parameters of the physical components described at the envisaged level (TAB4 and TAB5).

Step 5: The assignment 5 of the physical parameters contained in the arrays TAB4 and TAB5 to the labeled signals of the paths in TAB3. The output is the associative array TAB6.

Advantageously, the method is repeated when the inputs change: modification of the description of the circuit or execution of a new simulation (modification of the arrays TAB4 and TAB5).

The various steps are described hereinafter in greater detail:

Step 1:

This step consists in analyzing the description of the circuit (for example in the VHDL or VERILOG or SystemC or SystemVERILOG language) and in extracting the name of the modules and that of the physical components represented (NAME). The output is a list of names, written in the following array TAB1 (the entries of the array are tagged by indices (0, 1, . . . ):

TAB1

Step 2:

This step consists firstly in analyzing the hardware description of the circuit (for example in the VHDL or VERILOG language) and in extracting the list of paths (as defined hereinabove). Algorithms and tools capable of performing this operation exist. The method writes each path in an associative array TAB2. An entry is created for each identified path. The key field comprises the name of the path (Path). For each entry, the number of value fields is equal to the number of physical components constituting the path. A value field stores the name of the physical component (name). The order of arrangement of the physical components is of no significance.

Step 3:

This step is a labeling step which discriminates the physical components represented and not represented at the higher level considered. The operation consists in labeling the names of the physical components of TAB2 (for example the physical component d illustrated in FIG. 2) with names listed in TAB1.

A physical component of TAB2 is represented if its name appears in the arrays TAB2 and TAB1 otherwise it will be dubbed non-represented. When dealing with a represented physical component, the label will be its name. When dealing with a non-represented physical component, the label will be the name of the parent module which includes the non-represented physical component and whose name is listed in TAB1.

Thus, the name of a physical component not represented at the gate level is labeled with the name of the (parent) RTL module which includes this physical component.

The identification of the parent module may have been obtained beforehand with the aid of an analysis of the hierarchy of the IC at the gate level and cataloged in an ancillary array TAB2'.

An entry is created for each path. The key is the name of the path read in TAB2. The value fields comprise the labels.

For each entry, the number of value fields is equal to the number of physical components or of modules in TAB2 for this path. A value field stores the label of the physical component.

A label is a pattern consisting of two or three fields according to the number of physical parameters inserted into the arrays TAB4 and TAB5 as will be detailed hereinafter and which may advantageously integrate a discriminant.

The first field indicates whether one is dealing with a physical component represented (O) or non-represented (NO) which constitutes a discriminant.

The second field contains the name of the physical component (name).

In the case where at least two physical parameters are used in TAB4 and/or TAB5, the second field defines the index number of the physical parameter to be considered (param no.).

Step 4:

This step consists of the extraction of the physical parameters of the physical components described at the level of abstraction considered.

The simulation can start with the initialization of the registers and variables and the loading of the data in the memories of the circuit. At each simulation timestep, predefined stimuli are applied as input to the circuit and all the signals and registers and variables of the system are evaluated. The output of the simulation can provide a trace of the values of the signals, of the registers and of the variables at each timestep.

Two operations are combined in this step:

a first operation is the extraction of the physical parameters of the physical components represented, that is to say those described in the two levels of abstraction and listed both in TAB1 and TAB2. This operation can rely advantageously on a simulation of the circuit at the higher level of abstraction. This physical parameter is written in the associative array TAB4. An entry is created for each physical component. The key is the name of the physical component (NAME). Each entry can contain one or more fields. A field contains the value of the physical parameter of the physical component (Param) (for example the switching frequency).

a second operation is the extraction of the value or values of the estimated physical parameters of the parent modules, that is to say those listed solely in TAB1.

The physical parameters are extracted on the basis of a simulation/analysis of the IC at the higher level alone or the simulation/analysis is combined with a prior step of characterizing the physical parameters, which will be performed with the aid of a simulation/analysis at the gate level. The physical parameters obtained are written in the associative array TAB5.

In the case of a single path, shared over several modules, a unique value is allotted for the physical parameter of the parent module, there is no discrimination at the level of the various physical components belonging to one and the same module. The array TAB5 has an identical structure to that of the array TAB4. An entry is created for each parent module. The key contains the name of the parent module (NAME). The value fields store the value of the physical parameter (param).

In the case of several paths, shared over several modules, the physical parameters are discriminated, between the paths. Typically two paths can lead to two physical parameters for one and the same parent module. The array TAB5 is then formed by stringing together two associative sub-arrays. In the sub-array TAB5.1, an entry is created for each parent module. The key of this array is the name of the parent module. Each entry contains a value field which is a pointer (ptr) to the sub-array TAB.5.2 which contains the physical parameter or parameters of each path passing through this parent module. The paths have at least one physical component not represented which is a child of the parent module. The number of arrays is equal at most to the number of entry of the array TAB5.1. The key is the name of the path. Each entry of this array contains one or more value fields. A field stores the physical parameter of the parent module (param).

Step 5:

This step combines the arrays TAB3 with the arrays TAB4 and TAB5 so as to associate the physical parameter with the physical components of the paths. The output is the array TAB6. The method relies conventionally on operations of reading, searching and writing in the associative arrays. The reading and writing operations access the key and the value fields. The search operation consists in determining the index of the entry for which the key corresponds to the pattern sought.

An exemplary embodiment of this function is the sequential traversal of the keys from the first entry.

Figure 4:
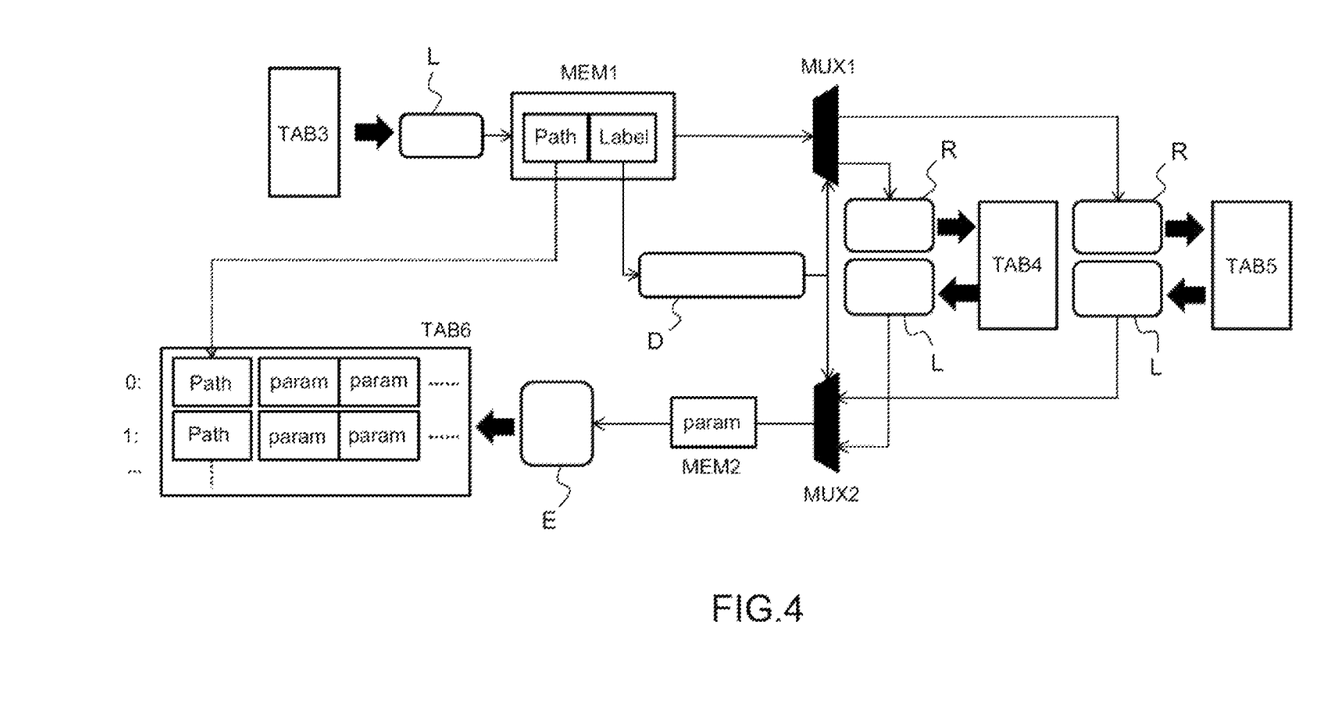
FIG. 4 illustrates in greater detail the operation of associating the labeling array and the fourth and fifth associative arrays so as to define the sixth associative array.

The inputs of this step 5 of the method are the arrays TAB3, TAB4 and TAB5. The details of this step are illustrated in FIG. 4 in which the following operations are referenced as follows:

the reading operation: L
the search operation: R
the writing operation: E
the discrimination operation: D This succession is executed for each entry and each value field of TAB3. An execution starts with the reading of the key of the entry pointed at in TAB3 (path).

An execution loop then runs in the following manner. The first step is the reading of the label of the first field of the entry selected from TAB3. The key and the value which are read are stored in the memory MEM1.

The label is then analyzed to determine whether or not one is dealing with a represented physical component (discrimination). If one is dealing with a represented physical component, the label in the memory MEM1 is dispatched to the search function of TAB4 otherwise the content of MEM1 is dispatched to the function of the array TAB5, via a multiplexer MUX1.

In the second variant, the search function for the array TAB5.1 receives as input the label. That for the array TAB5.2 receives as input the name of the path (path).

After determination of the input, the reading function for the array TAB5 recovers the value of the physical parameter (when several fields exist, the index number of the field to be read is contained in the label). The read physical parameter is stored in the memory MEM2. Its content and the name of the path (MEM1) are ultimately written in the array TAB6 having a structure identical to that of the array TAB3 (FIG. 4). The number of entry via the multiplexer MUX2 will be equal to that of TAB3. An entry is created for each path. The key is the name of the path currently being read in MEM1. The number of value fields is equal to the number of signals of the current path. The value field TAB6 receives the value contained in MEM2. A field will be created at each execution loop.

When a single path is to be considered, the parameters of a parent physical component are therefore shared by all its child physical components. In the second variant of TAB5, the operation assigns the physical parameters of the physical components parent to the "children" paths separately: two physical components which are the children of one and the same parent can have two different values of the same physical parameter.

The arrays TAB4 and TAB5/TAB5.1 can be combined into one and the same array. The value field also indicates whether one is dealing with a value of physical parameter or a pointer.

The notion of physical parameter of a parent can correspond to the average switching frequency of the internal signals (children), to the maximum/minimum of the switching frequencies of the internal signals or to the consumed power of the module or to the temperature of the module or the propagation lag of a signal over the metal line.

The method described hereinabove intervenes after simulation of the IC at the RTL (or higher) level. The method (step 5) can be also executed during the simulation of the IC at each simulation timestep or in a periodic manner between several simulation timesteps.

Figure 5:
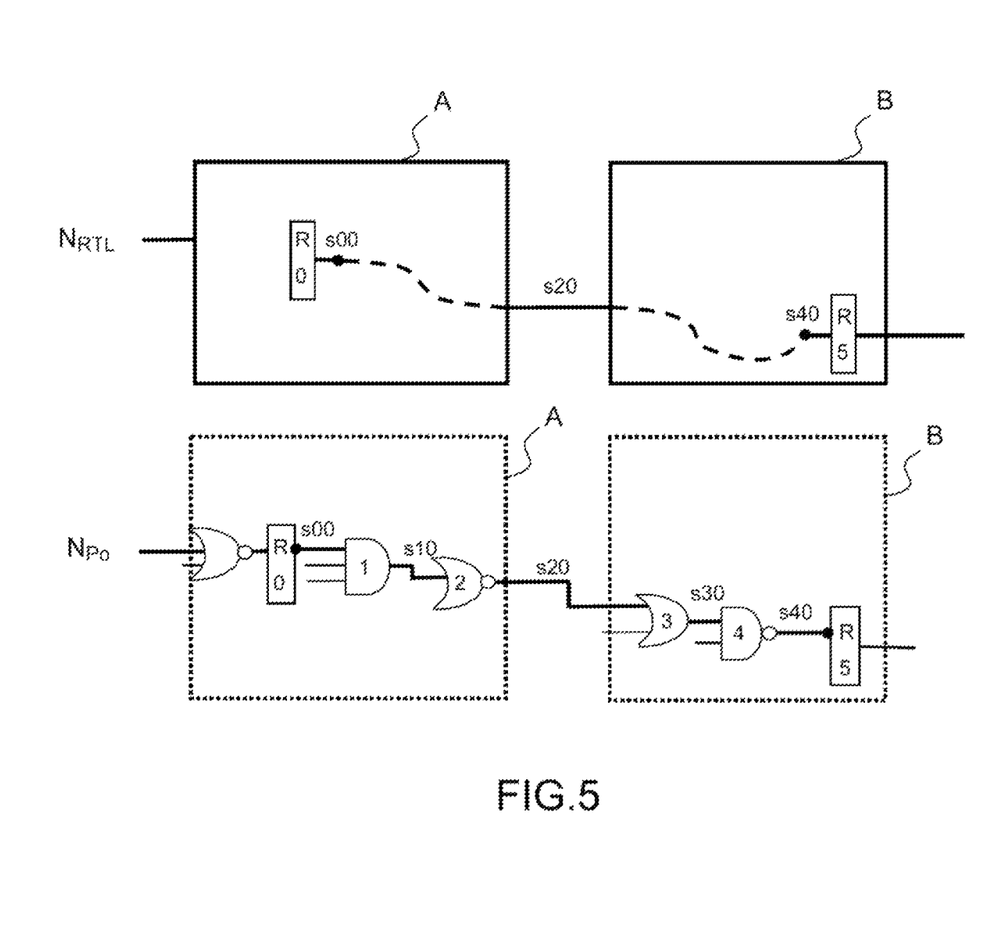
FIG. 5 illustrates an exemplary integrated circuit composed of a path distributed over two modules in which only the signals along said path are considered.

Example of Implementation of the Method of the Invention at the RTL Level:

Let us consider the example of an IC composed of a path P distributed over 2 modules A and B, which are described at the RTL level. Only the signals of the paths are considered. The physical parameter studied is the switching frequency of the signal or the activity, that is to say the ratio of the number of clock cycles of the IC to the number of changes of its value (0 to 1 and vice versa).

The example is illustrated in FIG. 5. Only the signals (physical components) useful to the example are described at the gate level.

After realization of Steps 1 and 2, the arrays TAB1 and TAB2 are defined as represented hereinafter:

| TAB1 | |
|---|---|
| 0: | A |
| 1: | B |
| 2: | S00 |
| 3: | S20 |
| 4: | S40 |

A, B being the names of the modules, s00, s20 and s40 being the names of the physical components represented.

| TAB2 | | | | | | |
|---|---|---|---|---|---|---|
| 0: | P | s00 | s10 | s20 | s30 | s40 |

The array TAB2 comprises a single entry corresponding to the path whose name P is indicated in the key field.

s00, s10, s20, s30 and s40 are inscribed in the value fields indicating the names of the signals arising from the physical components. The signals will subsequently be likened to the components from which they arise. An observable signal corresponds to a represented component and a non-observable signal to a non-represented component.

Step 3:

In the realization of step 3, the label array TAB3 hereinafter is defined. In the array TAB2, the signals s00, s20 and s40 are represented (label with pattern O) whereas the signals s10, s30 and s40 are not (label with as discriminant the pattern NO). The signals s10, s30 and s40 are labeled respectively with the membership modules A and B.

| TAB3 | | | | | | | | | |
|---|---|---|---|---|---|---|---|---|---|
| 0: | P | O | s00 | NO | A | O | s20 | NO | B | O | s40 |

Step 4:
4.1.: Realization of the Table TAB4:

After simulation of the circuit at the RTL level, the values of the signals s00, s20 and s40 and the number of simulation cycles are collected. The switching frequency of the signals AC is calculated and written in the array TAB4.

The array contains three entries (three signals represented). The name of the signal is written in the key field and the value of the physical parameter AC is written in the value field.

| TAB4 | | |
|---|---|---|
| 0: | s00 | AC00 |
| 1: | s20 | AC20 |
| 2 | s40 | AC40 |

4.2: Realization of the Table TAB5:

Concerning the estimation of the activity of the modules A and B, a fairly precise approach is to characterize the activity of the internal signals of the modules.

The procedure starts with a gate description of the IC. A set of input stimuli is generated in a random manner. The simulation of the circuit is performed with these stimuli. The total activity of the signals AC of the path is calculated for each module separately: $AC_A$ for module A and $AC_B$ for module B, making it possible to define the activity which will be able to be associated with the non-represented physical components.

The second variant of TAB5 is the best realization (better precision).

For module A, the value $AC_A$ corresponds to the sum of the activities of the signals s00 and s10. An entry is created in TAB5.1. The key field receives the symbol A and the value field contains the pointer making it possible to point at the array TAB5.2 relating to module A.

The array TAB5.2 relating to module A is created with an entry. The symbols P and ACa are written respectively in the key field and in the value field.

Step 5:

In the course of this step, the first path P in TAB3 is selected. An entry is created in the array TAB6 and the identifier "P" is written in the key field. The first value field s00 is read.

The label "0|s00" corresponds to the signal represented "s00"; the array TAB4 is selected and the name "s00" is searched for in the key of the entries of TAB4. The value AC00 is written in the first value field of TAB6. The second field of TAB3 contains the label "NO|A"; the signal is non-observable. The array TAB5.1 is selected and then the name "A" is searched for in the key of the entries of this array. The array TAB5.2 is selected and then the symbol "P" is searched for in the key of the entries. Finally, the value field is read. The content ACa will be written in the $2^{nd}$ field of the first entry (0:) of TAB6.

It is thus possible to calculate the total activity of the path "P" at the RTL level (sum of the value fields of the array TAB6 which are associated with the key P) or the degradation of the propagation time of the path by inserting the value fields into the equation given in the article by Clement Bertolini, Olivier Heron, Nicolas Ventroux, François Marc, "Relation between HCl-induced performance degradation and applications in a RISC processor", IOLTS 2012.

Example of Method of the Invention Using a Higher Level of RTL:

The method can also be applied at the transactional-behavioral level (TLM), the IC is described with behavioral modules (for example a memory or a calculation unit or a control unit) and TLM ports or interfaces which connect the modules together (SystemC language).

In general, only the behavior of the component is described in the module (fairly similar to a state machine). The SystemC language offers a freedom in the way to describe the system. There are nonetheless rules for allotting a name to the variables to be complied with so as to guarantee that the labeling operation runs properly.

Given that the notion of signal is also present in the SystemC language, the name of a SystemC signal must also exist in the gate description of the IC.

A TLM interface is manifested by a data structure which is read and written by the modules. The structure contains one or more variables of a predefined type (for example 32-bit integer).

The data structure models the behavior of a group of real signals. A correspondence must exist between the name of the signals at the gate level and the name of the variables in this structure.

The invention claimed is:

1. A method implemented by an integrated circuit analysis computer for analyzing a behavior of an integrated circuit comprising paths and physical components,
    said physical components being either not represented in a first level of abstraction at least equal to or higher than a Register Transfer Level (RTL) level, or represented in said first level of abstraction;
    said integrated circuit comprising a set of modules comprising physical component(s);
    each module defining a function between an input signal and an output signal, and
    the physical components, paths and the modules each being identified by a name,
said method comprising the following steps:
    a first step, generating a first array with the integrated circuit analysis computer that includes extracting a first set of names corresponding to the physical components represented and to the modules;
    a second step, generating two associative arrays with the integrated circuit analysis computer comprising an extraction of the names of the paths and the names of the physical components for each of said paths and an assignment of a membership module name to said physical components;
    a third step, generating a third associative array with the integrated circuit analysis computer that include allotting a label to the set of physical components, said label comprising:
        the name for the components represented by a name in the first array and the two associative arrays;
        the name of the membership module for the components not represented by a name in the first array and the two associative arrays;
    a fourth step, generating fourth and fifth associative arrays with the integrated circuit analysis computer that includes determining at least one physical parameter for each of the components represented and for each of the modules, and of associating the names of the components represented with the physical parameters determined, and of associating the names of the components represented and of associating the names of the modules with the physical parameters determined, and where said at least one physical parameter including at least one of the following: a switching frequency of a signal, or a holding time of a signal, or an activity corresponding to a ratio between a (total) number of change of value or a number of cycles of holding at 1 or a number of cycles of holding at 0 of a signal and a number of cycles of a clock signal or a propagation lag of a logic cell;
    a fifth step of assigning with the integrated circuit analysis computer the physical parameters contained in the fourth and fifth associative arrays to the physical components contained in the third associative array, the fifth step generating a sixth associative array having a content that provides for a calculation of a total activity of the path or of a degradation of a propagation time of the path; and an identification with the integrated circuit analysis computer of a final integrated circuit configuration and transfer to an integrated circuit manufacturing tool to have the integrated circuit manufactured.

2. The method for analyzing the behavior of an integrated circuit implemented by the integrated circuit analysis computer as claimed in claim 1, wherein the physical parameters of the physical components represented are obtained by simulation/analysis of the circuit at a higher level.

3. The method for analyzing the behavior of an integrated circuit implemented by the integrated circuit analysis computer, as claimed in claim 1, wherein the assignment of a module to a physical component not represented is carried out by analysis of a hierarchy of the integrated circuit at a gate level.

4. The method for analyzing the behavior of an integrated circuit implemented by the integrated circuit analysis computer, as claimed in claim 1, wherein at least one module is being traversed by several paths, the fourth step of determining at least one physical parameter for each of the modules comprises:
   a step of stringing together at least two sub-steps:
      a first sub-step of pointing at the paths traversing each module;
      a second sub-step of determining for each path pointed at, the
   physical parameter associated with said module.

5. The method for analyzing the behavior of an integrated circuit implemented by the integrated circuit analysis computer, as claimed in claim 1, wherein the third step allotting a label to the set of physical components further comprises assigning of a discriminant of a state represented and not represented, to each of the physical components.

6. The method for analyzing the behavior of an integrated circuit implemented by the integrated circuit analysis computer, as claimed in claim 1, comprising a construction of associative arrays with input keys and value fields that utilize the results of the second, third, fourth and fifth steps.

7. The method for analyzing the behavior of an integrated circuit implemented by the integrated circuit analysis computer, as claimed in claim 1, wherein the first level of abstraction at least equal to or higher than the RTL level is a transactional-behavioral level, the modules being behavioral modules that comprise at least one memory or a calculation unit or a control unit and transactional-behavioral level (TLM) ports or interfaces which connect the modules together.

8. A method for analyzing the behavior of an integrated circuit implemented by the integrated circuit analysis computer, comprising:
   the steps of the method of functional analysis, implemented by the integrated circuit analysis computer, of an integrated circuit as claimed in claim 1;
   including a succession of at least two series of operations shifted in time for:
      said fourth step of determining at least one physical parameter for each of the components represented and for each of the modules, and of associating the names of the components represented and the names of the modules, with the physical parameters determined, the determination of at least one physical parameter for the physical components represented being a basis to establish a fourth associative array comprising the name of the physical components and their associated physical parameter;
      a step of comparing of the fifth step of assigning physical parameters determined and named in the fourth step, to the physical components named in the second extracting step, being a basis to follow a temporal evolution of said integrated circuit.

9. A computer program comprising a non-transitory recording medium storing instructions that when executed by a processor of an integrated circuit analysis computer analyze a behavior of an integrated circuit comprising paths and physical components, said physical components being either not represented in a first level of abstraction at least equal to or higher than a Register Transfer Level (RTL) level, or represented in said first level of abstraction; said integrated circuit comprising a set of modules comprising physical component(s); each module defining a function between an input signal and an output signal, the physical components, paths and the modules each being identified by a name,
said instructions comprising:
   generating a first array with the integrated circuit analysis computer that includes extracting a first set of names corresponding to the physical components represented and to the modules;
   generating two associative arrays with the integrated circuit analysis computer comprising an extraction of the names of the paths and the names of the physical components for each of said paths and an assignment of a membership module name to said physical components;
   generating a third associative array with the integrated circuit analysis computer that includes allotting a label to the set of physical components, said label comprising: the name for the components represented by a name in the first array and the two associative arrays; and the name of the membership module for the components not represented by a name in the first array and the two associative arrays;
   generating fourth and fifth associative arrays with the integrated circuit analysis computer that include determining at least one physical parameter for each of the components represented and for each of the modules, and of associating the names of the components represented with the physical parameters determined, and of associating the names of the components represented and of associating the names of the modules with the physical parameters determined, and where said at least one physical parameter including at least one of the following: a switching frequency of a signal, or a holding time of a signal, or an activity corresponding to a ratio between a (total) number of change of value or a number of cycles of holding at 1 or a number of cycles of holding at 0 of a signal and a number of cycles of a clock signal or a propagation lag of a logic cell;
   assigning with the integrated circuit analysis computer the physical parameters contained in the fourth and fifth associative arrays to the physical components contained in the third associative array, and generating a sixth associative array having a content that provides for a calculation of a total activity of the path or of a degradation of a propagation time of the path; and
   identifying with the integrated circuit analysis computer a final integrated circuit configuration and transfer to an integrated circuit manufacturing tool to have the integrated circuit manufactured.

10. A design module configured to be embedded onboard an integrated circuit, the design module comprising an integrated circuit analysis computer having at least one calculation unit and a memory, the integrated circuit analysis computer configured to analyze a behavior of an integrated circuit comprising paths and physical components, said physical components being either not represented in a first level of abstraction at least equal to or higher than a Register Transfer Level (RTL) level, or represented in said first level of abstraction; said integrated circuit comprising a set of modules comprising physical component(s); each module defining a function between an input signal and an output signal, the physical components, paths and the modules each being identified by a name, said design module comprising:
- the integrated circuit analysis computer configured to generate a first array with that includes extracting a first set of names corresponding to the physical components represented and to the modules;
- the integrated circuit analysis computer configured to generate two associative arrays comprising an extraction of the names of the paths and the names of the physical components for each of said paths and an assignment of a membership module name to said physical components;
- the integrated circuit analysis computer configured to generate a third associative array that includes allotting a label to the set of physical components, said label comprising: the name for the components represented by a name in the first array and the two associative arrays; and the name of the membership module for the components not represented by a name in the first array and the two associative arrays;
- the integrated circuit analysis computer configured to generate fourth and fifth associative arrays that include determining at least one physical parameter for each of the components represented and for each of the modules, and of associating the names of the components represented with the physical parameters determined, and of associating the names of the components represented and of associating the names of the modules with the physical parameters determined, and where said at least one physical parameter including at least one of the following: a switching frequency of a signal, or a holding time of a signal, or an activity corresponding to a ratio between a (total) number of change of value or a number of cycles of holding at 1 or a number of cycles of holding at 0 of a signal and a number of cycles of a clock signal or a propagation lag of a logic cell;
- the integrated circuit analysis computer configured to assign the physical parameters contained in the fourth and fifth associative arrays to the physical components contained in the third associative array, and generating a sixth associative array having a content that provides for a calculation of a total activity of the path or of a degradation of a propagation time of the path; and
- the integrated circuit analysis computer configured to identify a final integrated circuit configuration and transfer to an integrated circuit manufacturing tool to have the integrated circuit manufactured.

\* \* \* \* \*